United States Patent [19]

Terada et al.

[11] Patent Number: 4,933,906

[45] Date of Patent: Jun. 12, 1990

[54] NON-VOLATILE SEMICONDUCTOR MEMORY DEVICE

[75] Inventors: Yasushi Terada; Takeshi Nakayama; Kazuo Kobayashi, all of Hyogo, Japan

[73] Assignee: Mitsubishi Denki Kabushiki Kaisha, Tokyo, Japan

[21] Appl. No.: 288,791

[22] Filed: Nov. 18, 1988

[30] Foreign Application Priority Data

Apr. 22, 1988 [JP]  Japan .................................. 63-100509

[51] Int. Cl.$^5$ .............................................. G11C 7/00
[52] U.S. Cl. ................................ 365/208; 365/230.03; 365/204
[58] Field of Search .................... 365/230.03, 203, 204, 365/207, 208, 189.11

[56] References Cited

U.S. PATENT DOCUMENTS 4,503,522  3/1985  Etoh et al. ........................... 365/203

FOREIGN PATENT DOCUMENTS 54-151392  8/1984  Japan .
62-170097  7/1987  Japan .

OTHER PUBLICATIONS

F. Masouka et al., "A 256k Flash EEPROM Using Triple Polysilicon Technology", ISSCC 85, Feb. 14, 1985, Digest of Technical Papers, pp. 168, 169 and 335.
R. Zeman et al., "A 55ns CMOS EEPROM", ISSCC84, Feb. 23, 1984, Digest of Technical Papers, pp. 144–145.
M. Yoshida et al., "An 80ns Address-Data Multiples 1Mb CMOS EPROM", ISSCC, Feb. 25, 1987, Digest of Technical Papers, pp. 70, 71 and 342.

Primary Examiner—Joseph A. Popek
Attorney, Agent, or Firm—Lowe, Price, Leblanc, Becker & Shur

[57] ABSTRACT

A semiconductor memory device of erasable programmable rear only memory type is disclosed the memory device has a pair of memory cell arrays between which a differential amplifier is provided. Each of the memory cell arrays has a current-to-voltage converter circuit associated therewith. When a memory cell in either one of the pair of memory cell array is selected, a bit line being coupled to the selected memory cell is charged by one current-voltage conversion circuit, while at the same time at least one bit line in the other memory cell array where no memory cell has been selected is charged by the associated current-voltage converter circuit at arrayed different from the bit line coupled to the selected memory cell. A differential amplifier senses and amplifies a potential difference between the charged bit lines to provide a high speed read-out of the memory device.

13 Claims, 9 Drawing Sheets

NON-VOLATILE SEMICONDUCTOR MEMORY DEVICE

BACKGROUND OF THE INVENTION

1. Field of the Invention

This invention relates generally to a non-volatile semiconductor memory device, and in particular to a non-volatile semiconductor memory device capable of high speed read-out operation.

2. Description of the Prior Art

One typical non-volatile semiconductor memory device is an electrically erasable programmable read only memory or EEPROM and its overall arrangement is illustrated in the block diagram of FIG. 1.

Referring to FIG. 1, the EEPROM includes a memory array 50 formed of a plurality of EEPROM cells, a row address buffer 51 and a column address buffer 52 which receive externally applied row address signals and externally applied column address signals, respectively. The EEPROM also includes a row decoder 53 and a column decoder 54. The row decoder 53 decodes the address output from the row address buffer 51 and activates a word line coupled to a particular memory cell to be selected in the memory array while the column decoder 54 decodes the address output from the column address buffer 52 to activate a Y gate to connect a bit line coupled to the particular memory cell to I/O line. A sense amplifier 56 senses via a Y gate 55 a data signal stored in the memory cell which has been selected by the row and column decoders. The sensed signal is amplified in the sense amplifier and fed out through an output buffer 57. Included also in the EEPROM is an input buffer 58 for providing control signals to various circuits associated with the memory array.

In FIG. 2, there is shown a schematic circuit diagram of the memory array and Y gate of FIG. 1.

Referring to FIG. 2, the Y gate 55 comprises a transistor 8 connected between an I/O line 10 and a bit line 6, and a transistor 9 connected between the CG line 11 and a control gate line 5. To the gates of these transistors 8 and 9, a Y gate signal Y2 is supplied. A similar transistor arrangement is provided for a Y gate signal Y1.

In the configuration of the memory cell array of FIG. 2, only four memory cells are shown for storing four bits of data. Each memory cell comprises a memory transistor 3 having a floating gate, and a select transistor 2 for transferring a data signal stored in the memory transistor 3 to a bit line 6. The gate of the select transistor 2 is coupled to a word line 1. Another select transistor 4 is provided to transfer a signal on the control gate line to the gate of the memory transistor 3. The gate of the select transistor 4 is coupled to the word line 1.

To briefly describe the operation, the memory transistor 3 is capable of taking two different storage or logic states depending on whether electrons are accumulated on its floating gate. When electrons are injected into the floating gate of the transistor 3, the threshold voltage of the transistor shifts high, and therefore the transistor is non-conductive during read-out operation. This condition is defined as a logic "1" state. On the other hand, when electrons are removed from the floating gate, the threshold voltage of transistor 3 shifts low, and the transistor 3 is conducting during the read-out operation. This condition is defined as a logic "0" state.

The sense amplifier provides a read-out voltage to the bit line 6 via the transistor 8. From the bit line 6, the read-out voltage is fed to the memory transistor 3 through the transistor 2. This enables the sense amplifier to detect whether the current flows through the transistor 3 or not, that is, to read the stored data of the memory transistor 3.

FIG. 3 schematically illustrate one prior art sense amplifier which is disclosed in Japanese Laying-Open Gazette No. 170097/1987.

The sense amplifier 56 of FIG. 3 includes a current-to-voltage converter circuit 56a for performing a current to voltage conversion of the data stored in the memory cell, and an inverter circuit 56b for inverting the output of the converter circuit. The current-to-voltage converter 56a comprises P-channel MOS transistors 15 and 18, and N-channel MOS transistors 16, 17 and 19.

Now the operation of the sense amplifier 56 is briefly described in conjunction with a memory cell transistor 30a of an EPROM, but it operates much the same way in connection with a memory cell of the EEPROM.

In read-out operation, when the transistor 3a is in a logic state to render it conductive, a node N1 is brought to about 1.0 V. As a result, a transistor 16 is moderately or slightly turned on, bringing a node N2 to about 2 V. Then, the transistors 17 and 19 turn on slightly, but a node N3 is brought only to about the same voltage level as the node N1 (i.e. 1.0 V) because the on resistance of the transistor 18 is preselected much higher than that of the transistor 19.

When the transistor 3a is in a logic state to render it non-conductive during the read-out operation, the bit line 16 is charged by a supply voltage Vcc applied thereto through the transistor 18, and the node N1 is brought to about 1.1 V. This also brings the node N2 to about 1.8 V, and the voltage between the gate and source of the transistors 17 and 19 to about 0.7 V. Thus, the transistors 17 and 19 are turned off, and the node N3 is brought up to 5 V.

With the configurations of the prior art EEPROM and EPROM as briefly stated above, as the density of the memory devices increases, the current flow through individual memory cell or the cell current decreases accordingly because of the reduction of the memory cell size. In order for the sense amplifier to detect the small cell current, it is necessary to reduce the sizes of the load transistors in the sense amplifier, for example, the transistor 18. The small size transistor 18 inevitably retards the charging of the bit line by the supply voltage Vcc, which, in turn, increases the time needed to read out the data stored in the memory cell.

FIG. 4 schematically illustrates a prior art flash EEPROM disclosed in a paper entitled "A 256k Flash EEPROM using Triple Polysilicon Technology" by F. Masuoka et al. which was presented in an ISSCC held Feb. 14, 1985.

Referring to FIG. 4, the flash EEPROM includes a plurality of reference cells in addition to the ordinary memory cells. A data stored in the memory cell and a signal from the reference cell are, after undergoing the current to voltage conversion, supplied to a differential amplifier for sensing the data stored in the selected memory cell. A major disadvantage of this type of EEPROM sensing scheme is that it is necessary to provide additional cells for the reference purpose and that it is extremely difficult to preset the threshold voltage or cell current of these reference cells.

In FIG. 5, there is shown a circuit diagram of a prior art read-only memory (or ROM) disclosed in Japanese Laying-Open Gazette No. 151392/1984.

Referring to FIG. 5, the ROM has a memory array divided into two sections (not shown). When a particular memory cell in one array section is selected, the other array section not including the selected memory cell provides a reference voltage. The reference voltage and a voltage from the selected memory cell are differentially amplified by the differential amplifier. This ROM differs in configuration from the ROM of this invention to be described below in that it does not includes a current voltage converter circuit.

An EEPROM which is of interest to this invention is disclosed in a paper entitled "A 55ns CMOS EEPROM" presented by R. Zeman et al. in the ISSCC held Feb. 23, 1984. The EEPROM disclosed in this paper includes memory cells arranged in pairs and each pair of cells are designed to be programmed to opposite state. The signals from the cell pair are differentially amplified by a suitable circuit. With this arrangement, storing one bit of data requires a memory cell area twice as large as in a conventional EEPROM.

Another memory device structure which is of interest to this invention is set forth in a paper entitled "An 80ns Address-Data Multiples 1Mb CMOS EPROM" presented by M. Yoshida et al. in the ISSCC held on Feb. 25, 1987. The disclosed EPROM does include a sense amplifier similar to that showing in FIG. 3 but does not include a circuitry for providing the reference voltage.

SUMMARY OF THE INVENTION

It is an object of this invention to provide a high density non-volatile semiconductor device capable of high speed read-out operation.

It is another object of this invention to provide a non-volatile semiconductor device which eliminates the need for reference memory cells to produce a reference voltage for reading the data stored in a memory cell of the device.

It is a further object of this invention to provide a high density EEPROM capable of high speed read-out operation.

It is a still further object of this invention to provide an EEPROM which eliminates the need for reference memory cells to produce a reference voltage for reading the data stored in the memory cells of the device.

Briefly stated, a non-volatile semiconductor memory device according to this invention includes a pair of memory cell arrays, each comprising a plurality of erasable programmable memory cells. The memory device also has an address input buffer circuit which produces an output signal upon receiving an externally applied address input signal. A decoder circuit operates in response to the output from the address input buffer circuit to select a particular memory cell in either of the pair of the memory cell arrays. A first voltage supply circuit applies a predetermined voltage on the bit line and the word line which are being coupled to the memory cell to be selected, while a second voltage supply circuit applies a predetermined voltage on at least one bit line in that memory cell array that does not include the selected memory cell. A current flow through the bit line associated with the selected memory cell is converted to a voltage by a first current-to-voltage converter circuit, and a current through the bit line in the non-selected memory cell array is converted to a voltage by a second current-to-voltage converter circuit. A differential amplifier is provided to develop a difference of the output voltages of the first and second current-to-voltage converter circuits. The difference between the output voltages of the first and second converter circuits is sensed by a differential amplifier.

With this novel arrangement of the invention, the differential amplifier rapidly develops a difference between the output voltages of the first and second current-voltage converter circuits, which, in turn, results in a quick detection of the potential difference of the two current-to-voltage converter circuits. The quick detection of the difference permits a high speed read-out of the data stored in the selected memory cell.

Also with the novel arrangement of the invention, the differential amplifier uses the output voltage from the second current-to-voltage converter as the reference voltage, thus eliminating the need for a separate circuit to produce the reference voltage.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
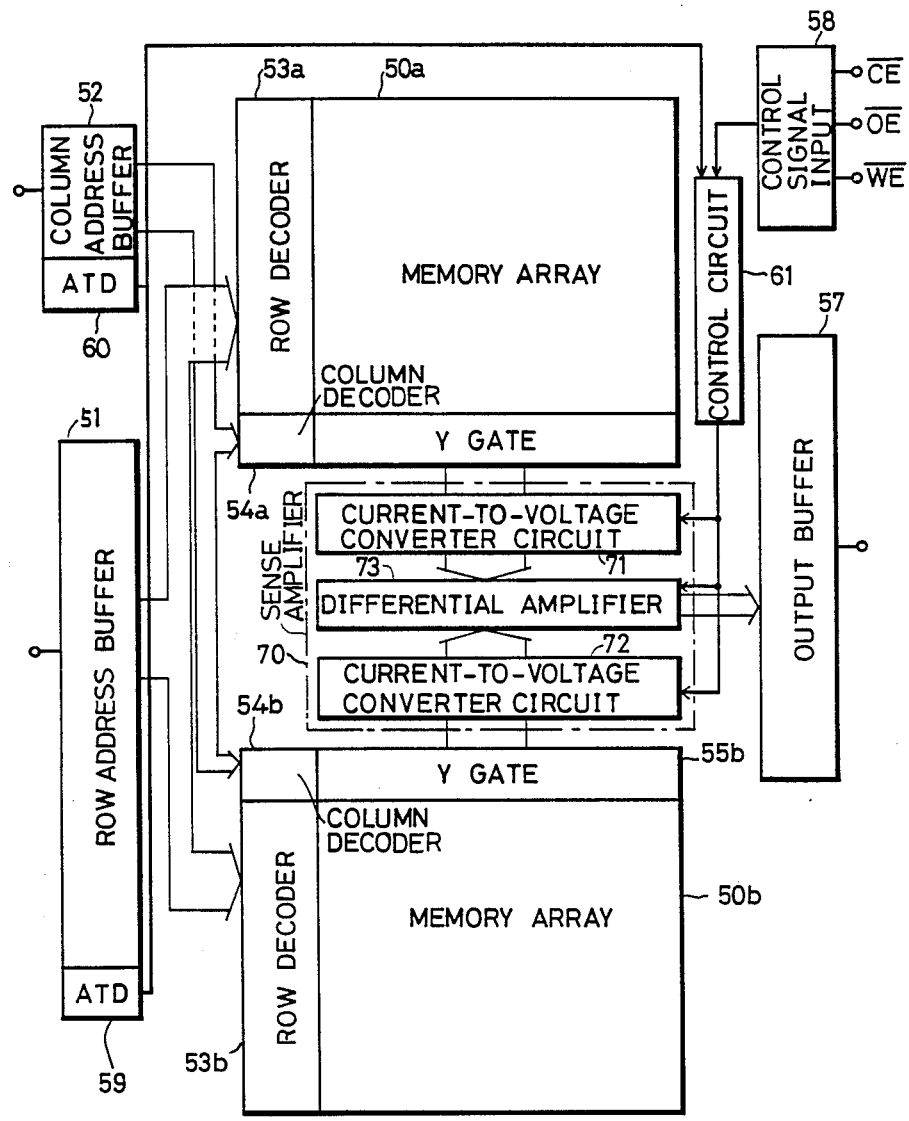
FIG. 6 is a block diagram of the EEPROM in accordance with this invention.

Referring to FIG. 6, there is shown a schematic diagram of an EEPROM in accordance with one preferred embodiment of this invention. In the preferred embodiment, the memory includes a pair of memory cell arrays 50a and 50b, a sense amplifier 70 for amplifying outputs from the memory cell arrays, and a control circuit 61 for generating various signals to control the operation of the sense amplifier 70. Coupled respectively to the memory cell arrays 50a and 50b are row decoders 53a and 53b, column decoders 54a and 54b and Y gates 55a and 55b.

A row address buffer 51 is connected to both row decoders 53a and 53b and row address signals fed externally to the row address buffer 51 are transferred to the row decoders 53a and 53b. Similarly, a column address buffer 51 is connected to column decoders 54a and 54b, and column address signals applied externally to the column address buffer 51 are fed to the column decoders 54a and 54b. Address transition detector (or ATD) circuits 59 and 60 are coupled to the row address buffer 51 and the column address buffer 52, respectively, and supply ATD pulses to a control circuit 61 whenever they sense a change in the address signal.

The EEPROM also includes a sense amplifier 70 which comprises a current-to-voltage converter circuit 71 connected to the memory cell array 50a, another current-to-voltage converter circuit 72 connected to the memory cell array 50b, and a differential amplifier 73 for differentially amplifying the output voltages from the current-voltage converter circuits 71 and 72. The converter circuits 71 and 72 and the differential amplifier 73 included in the sense amplifier operate in response to control signals from the control circuit 61.

Figure 7:
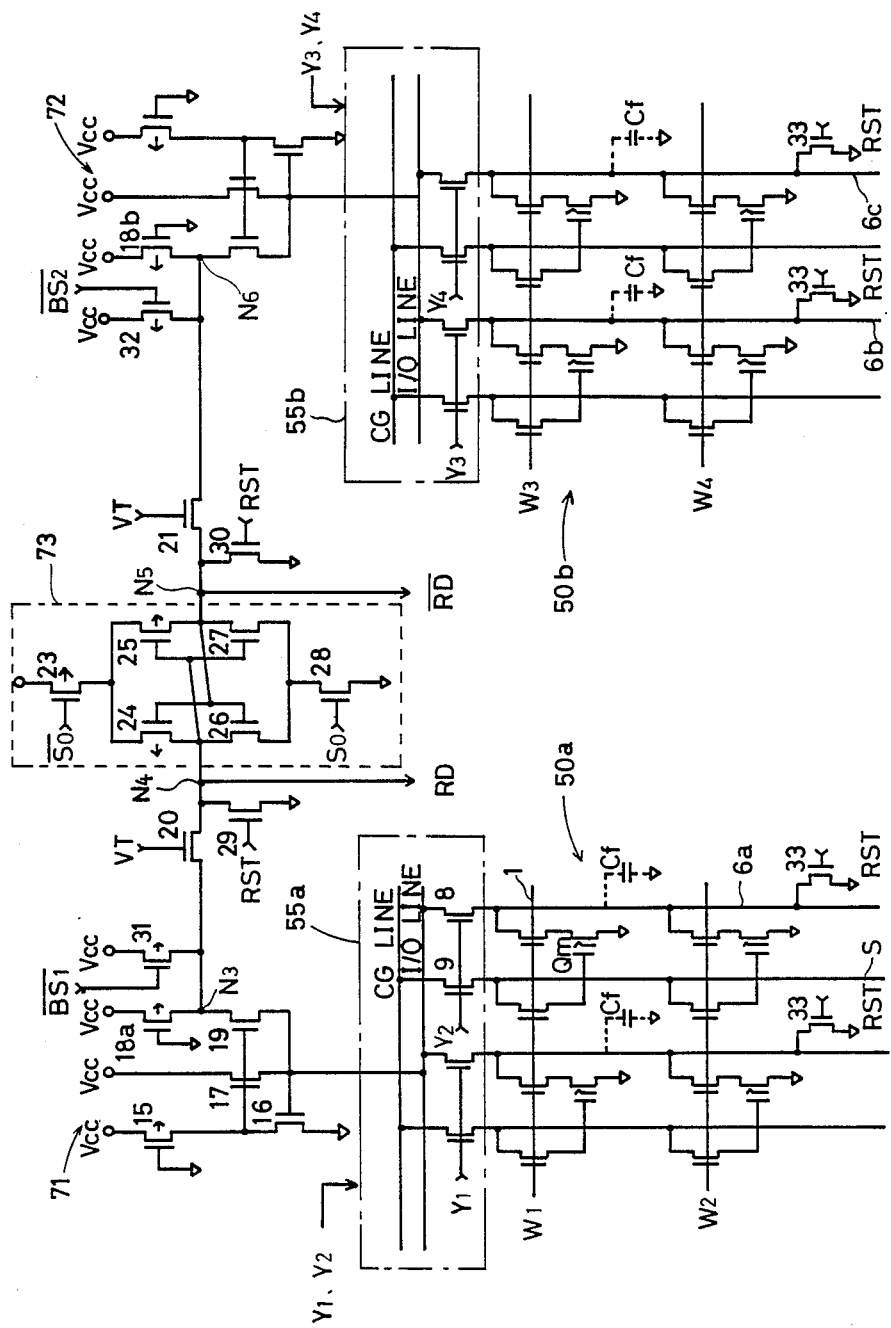
FIG. 7 is a circuit diagram of a sense amplifier employed in the EEPROM of FIG. 6.

FIG. 7 shows a schematic circuit diagram of a sense amplifier to be suitably used in the EEPROM of FIG. 6.

In the sense amplifier shown in FIG. 7, the current-to-voltage converter circuit 71 is connected to the memory cell array 50a, and the current-to-voltage converter circuit 72 is connected to the memory cell array 50b. A differential amplifier 73 receives output voltages from both current-to-voltage conversion circuits 71 and 72 and differentially amplify them.

The differential amplifier 73 includes P-channel MOS transistors 23–25 and N-channel MOS transistors 26–28. Of these MOS transistors, transistors 24–27 form a latch circuit as shown. Of the remaining two transistors, the transistor 23 operates in response to a signal $\overline{So}$ from a control circuit (not shown) to couple the latch circuit to a supply voltage, and the transistor 28 operates in response to a signal So from the control circuit to couple the latch circuit to ground.

Figure 1:
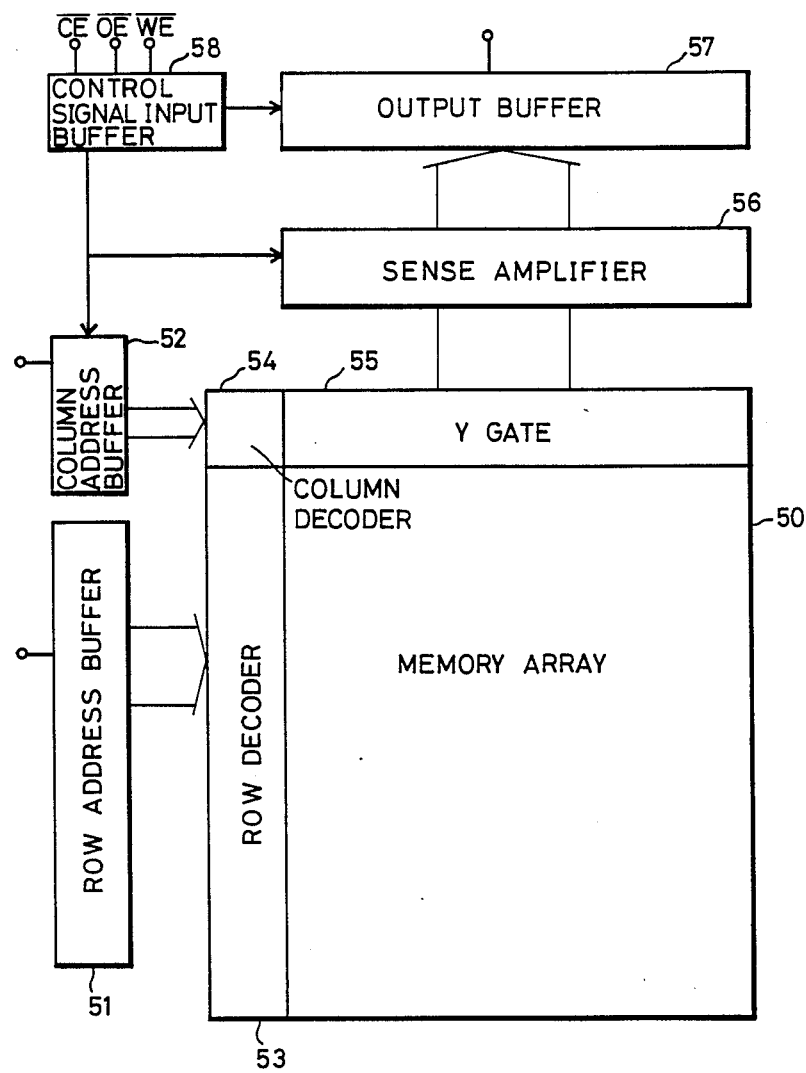
FIG. 1 is a block diagram of a prior art EEPROM.
Figure 2:
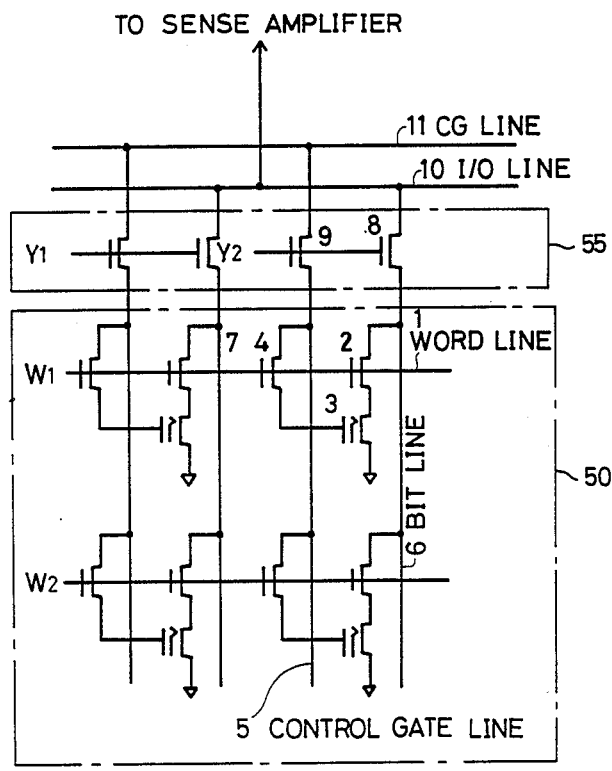
FIG. 2 is a circuit diagram of a memory cell array with an associated Y gate included in the EEPROM of FIG. 1.
Figure 3:
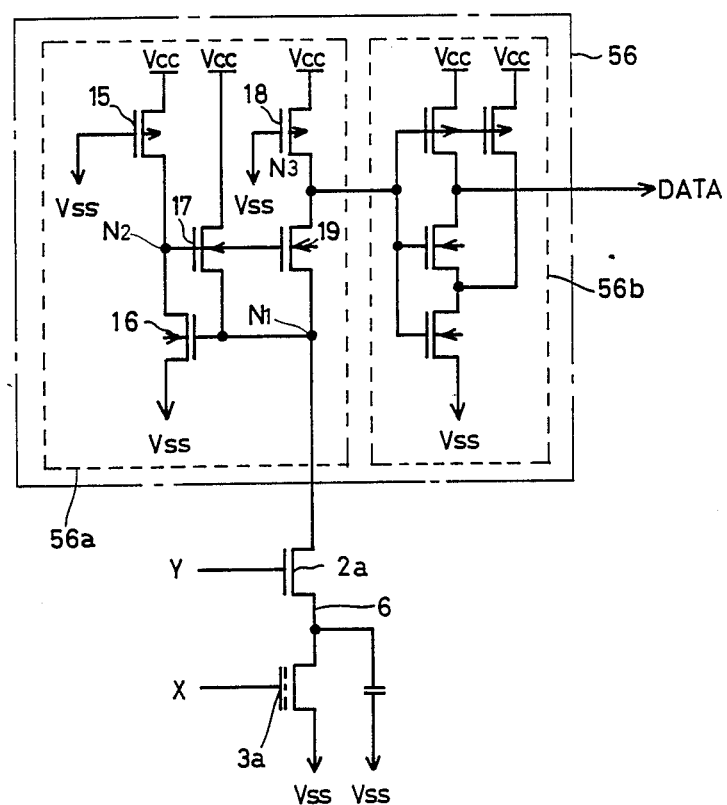
FIG. 3 is a circuit diagram of a typical prior art sense amplifier.
Figure 4:
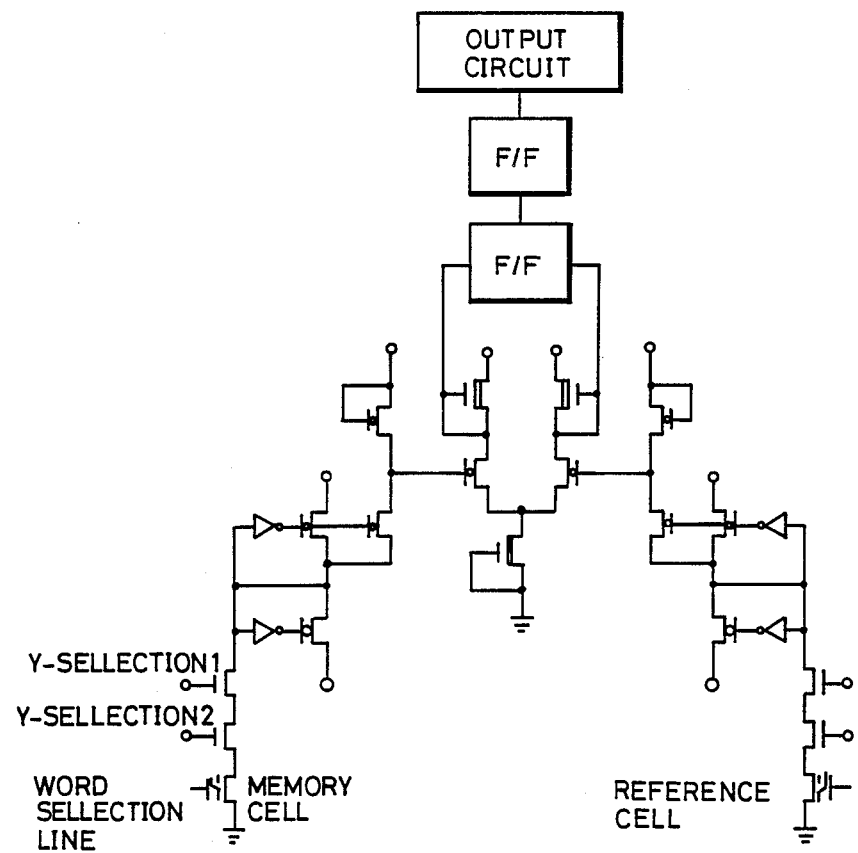
FIG. 4 is a schematic diagram of a prior art flash EEPROM.
Figure 5:
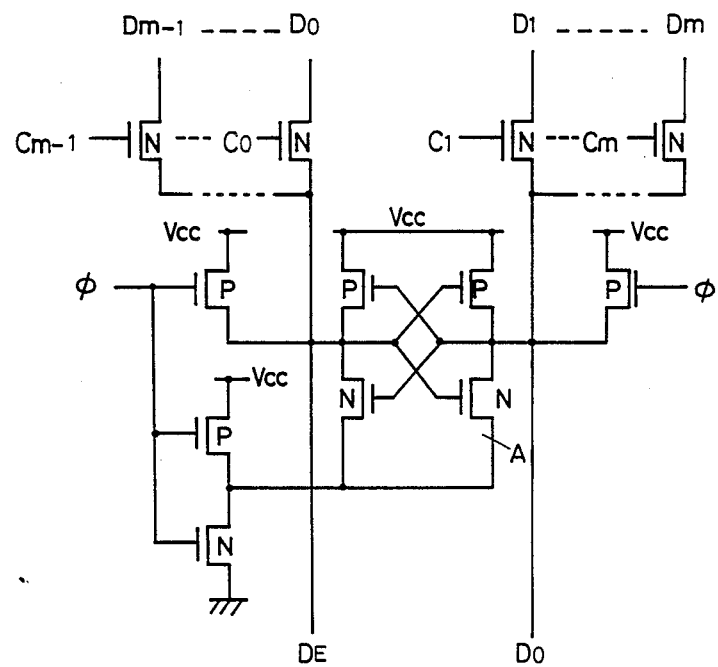
FIG. 5 is a schematic diagram of a prior art ROM.

The current-voltage conversion circuits 71 and 72 are identical in configuration and operation to the circuit of FIG. 3, but does not have the inverter circuit.

Besides the circuit components mentioned above, additional ones are provided in the sense amplifier in FIG. 7. Thus, a N-channel transistor 29 is connected between an input node N4 of the differential amplifier 73 and ground. Similarly a N-channel transistor 30 is connected between an input node N5 of the differential amplifier 73 and ground. These transistors 29 and 30 operate in response to the reset signal RST from the control circuit to reset the nodes N4 and N5, respectively, to the ground potential. A plurality of N-channel transistors 33 are provided between each of the bit lines and ground to reset the selected bit line to the ground potential in response to the reset signal RST from the control circuit.

P-channel transistors 31 and 32 are provided between the supply voltage Vcc and the current-to-voltage converter circuits 71 and 72, respectively. These transistors 31 and 32 operate in response to signals BS1 and BS2 from the control circuit which define the memory cell array to be selected. N-channel transistors 20 and 21 are connected between the differential amplifier 73 and the current-voltage converter circuits 71 and 72, respectively. When a potential difference appears between the input voltages from the converter circuits 71 and 72, the transistors 20 and 21 are turned off in response to signals VT from the control circuitry.

Figure 8:
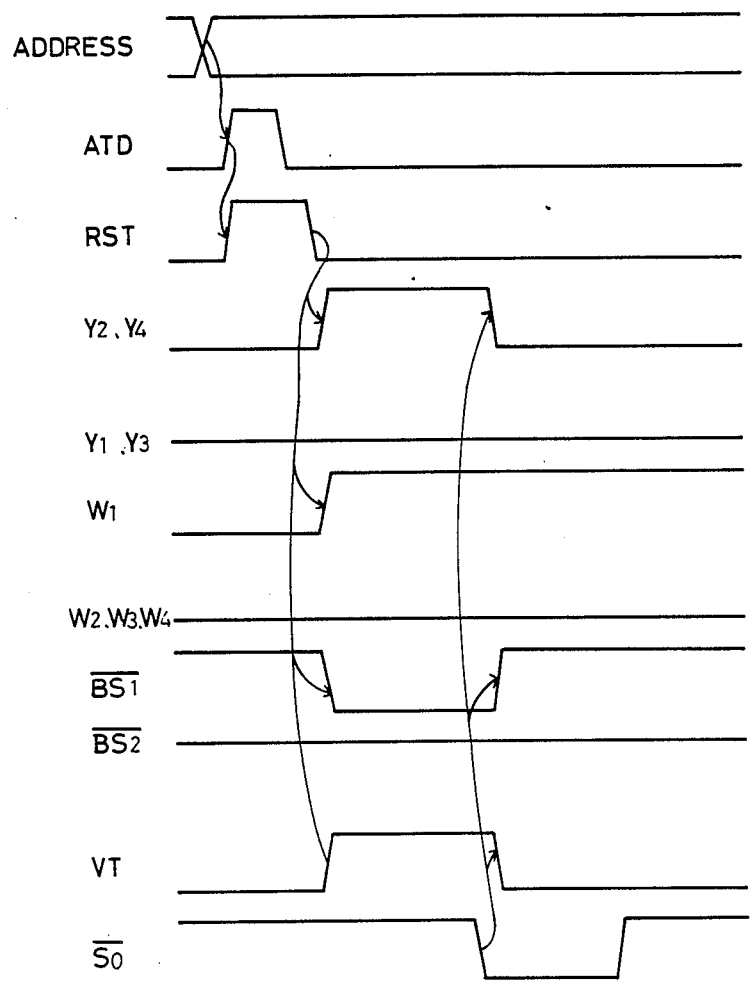
FIG. 8 is a timing diagram for controlling the operation of the circuitry shown in FIG. 7.

In FIG. 8, there is shown a timing diagram of various control signals applied to the sense amplifier in FIG. 7.

Referring to FIG. 8, the operation of the sense amplifier is explained. First, when the input address signal undergoes a change, the ATD circuit (such as the circuit 59 or 60 shown in FIG. 6) generates and supplies a ATD pulse to the control circuit (such as the circuit 61 of FIG. 6). Upon receipt of the ATD pulse, the control circuit produces a reset signal RST which turns on the transistors 29, 30 and 33. When these transistors are turned off, the input nodes N4 and N5 of the differential amplifier 73 and all the bit lines are brought to the ground potential thereby completing the reset operation.

When a particular memory cell, for example, a memory cell in the array 50a which includes a memory transistor Qm is to be selected, a high level signal W1 is developed on the word line 1 associated with the transistor Qm, and a high level Y gate signal Y2 is fed onto the gates of the transistors 8 and 9.

At the same time, in the other memory cell array 50b that does not include the selected memory cell, a high level gate signal such as a gate signal Y4 is similarly produced. At this point, a low level signal BS1 is supplied to the gate of the transistor 31 which is to be coupled to the selected memory cell array 50a, resulting in the conduction of the transistor 31. Also high level signals VT are fed to the gates of the transistors 20 and 21 to turn them on.

If the selected memory transistor Qm stores a logic "1", then this transistor is turned off during the read-out operation. As a result, the bit line 6a is charged by the supply voltage Vcc applied through the transistors 18 and 31, and the potential on the output node N3 of the current-voltage inverter circuit 71 goes high. Transistor 31 accelerates the change of the output node voltage.

On the other hand, in the non-selected memory cell array 50b, all the signals including signals W3, W4 supplied to the word lines being at a low level, the logic "1" signal is being read out from a bit line 6c as a reference signal. Thus, the bit line 6c is charged by the supply voltage Vcc through the transistor 18b. But, since the number of transistors available for charging the bit line in the non-selected memory cell array 50b is smaller than in the selected memory cell array 50a, the charging of the bit line is comparatively slow, so that the voltage (i.e. the reference voltage) at the output node N6 of the current-to-voltage converter circuit 71 rises slowly in comparison to the voltage rise at the node N3 of the current-to-voltage converter circuit 71.

When a potential difference appears between the nodes N3 and N6, a low level signal $\overline{So}$ is supplied to the transistor 23 to activate the differential amplifier 73 into operation, so that it amplifies the potential difference therebetween. Almost simultaneously, low level signals are fed to the transistors 20 and 21 to separate the differential amplifier 73 from the current-voltage converter circuits 71 and 72. This permits a faster reading of the stored logic "1" signal.

If a logic "0" signal has been stored in the memory transistor Qm in the array 55a, this transistor is turned on during the read-out operation. Meanwhile, current flows through the bit line 6a. So the node N3 remains low. On the other hand, the voltage (i.e. the reference voltage) on the node N6 gradually increases as stated hereinabove, causing a potential difference between the node N3 and the node N6. By amplifying this potential difference in the differential amplifier 73, the reading out of the logic "0" signal is performed at a faster rate.

It should be noted that the sizes of the transistor 31 and 32 are selected such that, when put into parallel with transistors 18a and 18b, respectively, they permit the desired potential difference to appear between the nodes N3 and N6 during the read-out operation.

While the bit line 6c has been described as being selected in the non-selected memory cell array 50b, any other bit line in the memory cell array 50b can suitably be addressed.

In the preferred embodiment, in order to charge the bit line associated with the selected memory cell, the transistor 31 is used in addition to the transistor 18a. However, other approaches may appropriately be employed to achieve the same purpose. For example, a stray capacitance Cf which exists between each of the bit lines and ground may be used to advantage and the voltage increase at node N6 is correspondingly slowed. Alternatively, instead of or in addition to using the transistors 31 and 32, provision may be made to keep both Y gate signals Y3 and Y4 at a higher level. With this approach, two bit lines are charged in the non-selected memory array, and the stray capacitance involved also doubles. Thus, the charging of these bit lines is made slower, and the voltage increase at the node N6 is decelerated compared to that of node N3.

As stated in detail hereinabove, by implementing a circuit configuration where the charging of the bit line in the non-selected memory cell array is performed at a rate different from the charging of the bit line associated with the selected memory cell array, a faster read-out operation is effectively and advantageously realized.

Other current-voltage converter circuits than those shown in FIG. 7 may suitably be employed as long as they are capable of providing high or low level voltage outputs upon sensing the cell current.

The differential amplifier of FIG. 7 comprises a circuit which is activated under appropriate timing control. Other differential amplifier configuration such as a current mirror type differential amplifier which is essentially static in operation may be employed.

Figure 9:
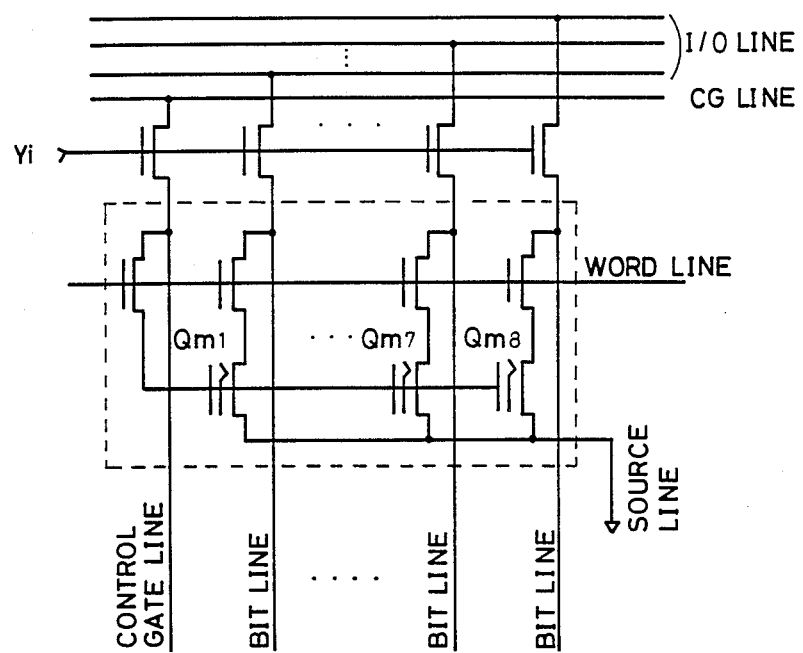
FIG. 9 is a schematic diagram showing in detail the configuration of the memory cell array in the EEPROM according to this invention.

While the EEPROM arrays are shown in simplified form in FIG. 7, FIG. 9 schematically illustrate the EEPROM array configuration in detail. For ease of understanding and description, it has been explained in connection to FIG. 6 that the reading of the memory cell is carried out in terms of bit. However, the read-out of the data stored in the EEPROM is actually done in terms of byte. Thus, in the EEPROM of FIG. 8, eight bits of data stored in memory transistor Qm1 to Qm8 are retrieved in a single read-out operation.

In FIG. 6, the ATD pulse is produced by the ATD circuits 59 and 60 whenever these circuit sense the transition being made in the address signals. However, a chip enable signal $\overline{CE}$ provided externally may be used instead of the ATD pulse.

Figure 10:
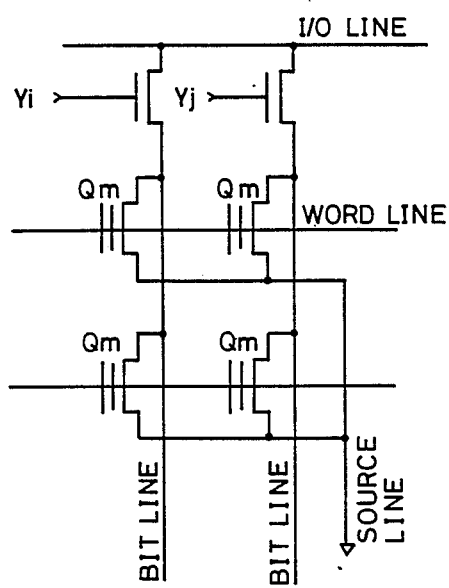
FIG. 10 is a schematic diagram of the memory cell array in an EEPROM to which this invention can be applied.

In FIG. 10, there is shown a schematic diagram of a part of an EPROM array. Although this invention has been described in conjunction with the EEPROM, it should be pointed out that the invention may equally be applied to the EPROM of FIG. 10 with the same result. With regard to the EPROM, the data stored in the memory cell Qm can be retrieved bit by bit.

As explained in detail hereinabove, the non-volatile semiconductor memory device of the electrically erasable programmable type has incorporated therein means for differentiating the rates at which the output voltages from one and the other current-to-voltage converter circuits change. With the incorporation of the voltage change alteration means, there has been provided a non-volatile semiconductor memory device which is capable of high speed read-out operation even at a higher component or cell density thereof, while eliminating the need for reference memory cells found in the prior art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device comprising:
    a plurality of erasable programmable memory cells arranged into a pair of memory cell arrays, each memory cell being coupled to one of a plurality of bit lines and one of a plurality of word lines;
    address input means for providing a bit line select signal and a word line select signal for selecting a particular memory cell in either of said memory cell arrays;
    a first voltage supply means for applying a first predetermined voltage on the bit line coupled to the memory cell to be selected in one of said memory cell arrays upon the selection of said memory cell;
    a second voltage supply means for applying a second predetermined voltage on at least one bit line in the memory cell array not including the selected memory cell simultaneously with the application of said first predetermined voltage on said bit line by said first voltage supply means;
    a first current-to-voltage converter means for converting a current flow through said bit line caused by the application of the first predetermined voltage by said first voltage supply means into a corresponding first output signal voltage;
    a second current-to-voltage converter means for converting a current flow through said bit line caused by the application of the second predetermined voltage by said second voltage supply means into a corresponding second output signal voltage;
    means for differentiating the rates at which the first and second output signal voltages of said respective first and second current-to-voltage converter means change; and
    means for detecting the voltage difference between the first and second output signal voltages of said first and second current-to-voltage converter means and producing a data output signal in response thereto.

2. A non-volatile semiconductor memory device according to claim 1 wherein said differentiating means comprises means for accelerating the change of the first output signal voltage from said first current-to-voltage converter means.

3. A non-volatile semiconductor memory device according to claim 2 wherein said accelerating means comprises a third voltage supply means responsive to an externally applied address signal to provide a predetermined voltage on the bit line coupled to said selected memory cell.

4. A non-volatile semiconductor memory device according to claim 3 wherein said third voltage supply means comprises;
    a voltage supply having a predetermined voltage level, and
    a first switching means connected between said voltage supply and said bit line coupled to said selected memory cell and operable in response to an externally applied address signal.

5. A non-volatile semiconductor memory device according to claim 1 wherein said differentiating means comprises means for decelerating the change of the first output signal voltage from said second current-to-voltage converter means.

6. A non-volatile semiconductor memory device according to claim 5 wherein said decelerating means comprises;
   ground potential means, and
   capacitance means to be connected between said ground potential means and said at least one bit line associated with said non-selected memory cell array.

7. A non-volatile semiconductor memory device according to claim 1 wherein said means for detecting the voltage difference comprises a differential amplifier.

8. A non-volatile semiconductor memory device according to claim 1 wherein said first and second current-to-voltage converter means include said first and second voltage supply means, respectively.

9. A non-volatile semiconductor memory device according to claim 1 wherein said memory cells included in said memory cell arrays comprise erasable programmable read only memory cells.

10. A non-volatile semiconductor memory device according to claim 9 wherein said erasable programmable read only memory cells comprise electrically erasable programmable read only memory cells.

11. An improved reading circuit for a memory in which data is stored in a form which is sensed as different impedance values, representing distinct values of said data, and which is divided into at least two selectable portions and including selecting means for selecting one of said selectable portions, said reading circuit comprising:
   means for providing current to each of said selectable portions, said current providing means presenting a predetermined impedance to said current and including means for presenting reduced impedance to one of said selectable portions in response to said selecting means,
   current-to-voltage conversion means, responsive to said current providing means for converting the value of current provided thereby to a voltage and
   differential voltage amplifying means responsive to voltages produced by said current-to-voltage conversion means for producing an output indicating the difference in current flowing to said selected portion and at least one non-selected portion.

12. A reading circuit for a memory having selectable memory cells presenting distinct resistive impedances in dependence on the value of data stored therein, when selected, said memory being divided into at least two selectable portions, each presenting a parasitic load, said memory further including portion selection means for selecting one of said selectable portions and memory cell selection means for selecting a memory cell in a portion of said memory selected by said portion selection means, said reading circuit comprising:
   current supply means for supplying current to each of said memory portions and presenting a predetermined resistive impedance to said current, said current supply means including means for presenting a reduced series impedance to said current supplied to a selected portion of said memory in response to said selection means;
   reset means for selectively connecting each of said selectable portions to a reference potential and disconnecting said selectable portion therefrom; and
   differential amplifier means for amplifying the difference between a voltage produced at a node between said reduced impedance and the resistive impedance presented by a selected memory cell and a voltage produced at a node between said series impedance and said parasitic load of a non-selected portion of said memory.

13. A method of reading data from a memory including a plurality of selectable memory cells by sensing of impedance of a selected one of said memory cells, wherein the memory is divided into at least two selectable portions, each of said selectable portions having at least one said selectable memory cells, said selectable portions presenting a parasitic load and wherein said memory includes means for applying a current to each of said selectable portions through a predetermined impedance comprising the steps of:
   connecting each of said selectable blocks to a source of reference potential;
   decreasing said predetermined impedance to a selected one of said selectable blocks;
   disconnecting each of said selectable blocks from said source of reference potential; and
   sensing a differential voltage between a node of a selected portion containing a selected memory cell and a corresponding node of a non-selected portion.

* * * * *